(12) United States Patent
Sarigiannis et al.

(10) Patent No.: US 6,835,664 B1
(45) Date of Patent: Dec. 28, 2004

(54) METHODS OF FORMING TRENCHED ISOLATION REGIONS

(75) Inventors: Demetrius Sarigiannis, Boise, ID (US); Garo J. Derderian, Boise, ID (US); Cem Basceri, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/609,279

(22) Filed: Jun. 26, 2003

(51) Int. Cl.[7] ............................................. H01L 21/311
(52) U.S. Cl. ..................................................... 438/700
(58) Field of Search ................................ 438/700, 680, 438/681, 770, 773, 774, 905, 954

(56) References Cited

U.S. PATENT DOCUMENTS

| | | | | |
|---|---|---|---|---|
| 5,983,906 A | * | 11/1999 | Zhao et al. | 134/1.1 |
| 6,039,834 A | * | 3/2000 | Tanaka et al. | 156/345.36 |
| 6,077,792 A | * | 6/2000 | Farrar | 438/780 |
| 6,413,827 B2 | * | 7/2002 | Farrar | 438/296 |
| 6,737,723 B2 | * | 5/2004 | Farrar | 257/510 |

FOREIGN PATENT DOCUMENTS

WO     WO 02/27063 A2    4/2002

OTHER PUBLICATIONS

"Atomic Layer Deposition of $SiO_2$ Using Catalyzed And Uncatalyzed Self–Limiting Surface Reactions", J.W. Klaus et al; Surface Review and Letters, vol. 6, Nos. 3 & 4 (1999) pp. 435–448.

*Self–limiting chemical vapor deposition of an ultra–thin silicon oxide film using tri–(tert–butoxy)silanol*, K.A., Miller et al; Thin Solid Films 397 (2001; pp. 78–82).
"Reactive Deposition of Metal Thin Films within Porous Supports from Supercritical Fluids", Neil E. Fernandes et al; Chem Mater. 2001; 13, pp. 2023–2031.
"Supercritical $CO_2$ Processing for Submicron Imagine of Fluoropolymers", Narayan Sundarajan et al; Chem. Mater. 2000; 12; p. 41–48.
"Supercritical carbon dioxide assisted aerosolization for thin film deposition, fine powder generation, and drug delivery", C.Y. Xu et al.; P.T. Anastas; T.C. Williamson, Green Chemistry, 5. pp. 313–335: Oxford University Press, Oxford 1998.
"Supercritical Fluid Transport–Chemical Deposition of Films", Brian N. Hansen et al.; Chem Mater. 1992; 4; pp. 749–752.

* cited by examiner

*Primary Examiner*—David Nhu
(74) *Attorney, Agent, or Firm*—Wells St. John P.S.

(57) ABSTRACT

The invention includes methods of forming films over substrates. A substrate is provided within a reaction chamber, and a mixture is also provided within the chamber. The mixture includes a precursor of a desired material within a supercritical fluid. The precursor is relatively reactive under one set of conditions and is relatively non-reactive under another set of conditions. The precursor and supercritical fluid mixture is initially provided in the chamber under the conditions at which the precursor is relatively non-reactive. Subsequently, and while maintaining the supercritical state of the supercritical fluid, the conditions within the reaction chamber are changed to the conditions under which the precursor is relatively reactive. The precursor reacts to form the desired material, and at least some of the desired material forms a film on the substrate.

10 Claims, 7 Drawing Sheets

US 6,835,664 B1

METHODS OF FORMING TRENCHED ISOLATION REGIONS

TECHNICAL FIELD

The invention pertains to methods of forming layers over substrates. In particular aspects, the invention pertains to methods of forming trenched isolation regions.

BACKGROUND OF THE INVENTION

There are numerous applications in which it is desired to form layers over substrates. For instance, it is frequently desired to form layers over semiconductor constructions during fabrication of integrated circuitry. Among the methods commonly utilized for layer formation are chemical vapor deposition (CVD) processes and atomic layer deposition (ALD) processes. A problem which can occur with CVD processes is that there is frequently less than 100% step coverage. For instance, if CVD is utilized to form a plug of material within a trench, there will frequently be a void present within the plug. The void forms because the deposition rate at the neck (top) of the trench is higher than that on the sidewall, and accordingly the entrance to the trench becomes pinched off by the depositing film before the trench is completely filled with the film.

ALD generally has better step coverage than CVD, and in some cases can come very close to, or even achieve, a voidless fill process. However, ALD can be slow, and (barring certain special cases, such as the catalytic ALD of $SiO_2$ using tetramethylaluminum and tris(tert-butoxy) silanol) the growth rates are typically on the order of about 1 Å per cycle.

Recently, it has been proposed to utilize supercritical fluids to deliver precursors to a surface during formation of layers. A frequently utilized supercritical fluid consists essentially of, or consists of $CO_2$.

The supercritical fluids are known to be exceptional solvents. The supercritical fluids are typically utilized by first providing a precursor within the supercritical fluid at high concentration, thus taking advantage of the solvent characteristics of the supercritical fluid. The supercritical fluid having the precursor dissolved therein is provided within a reaction chamber proximate to a substrate. Subsequently, the temperature and/or pressure conditions within the chamber are reduced so that the fluid is changed to a non-supercritical state. The fluid then lacks the solvent properties which can keep the precursor in solution, and accordingly the precursor falls out of solution and forms a layer (or a film) over the substrate.

Although supercritical fluid techniques can have advantages relative to ALD and CVD practices, there remains a need for improved methods of forming layers over substrates, and particularly for improved methods for forming layers over semiconductor substrates.

SUMMARY OF THE INVENTION

In one aspect, the invention pertains to a method of forming a layer of material on a substrate. A substrate is provided within a reaction chamber, and a mixture is also provided within the chamber. The mixture comprises a precursor of a desired material within a supercritical fluid, and is initially provided in the chamber under first conditions at which the precursor is stable. Subsequently, and while maintaining the supercritical state of the supercritical fluid, the conditions within the reaction chamber are changed to second conditions under which the stability of the precursor is altered relative to the first conditions. The precursor reacts under the second conditions to form the desired material, and at least some of the desired material forms a layer on the substrate. A difference between the first conditions and the second conditions can be, for example, that the second conditions comprise a higher temperature than the first conditions.

In one aspect, the invention pertains to a method of forming at least one trenched isolation region. A semiconductor substrate is provided within a reaction chamber, and the substrate has at least one trench extending therein. A mixture is provided within the chamber, with the mixture comprising a precursor of an electrically insulative material dissolved within a supercritical fluid. The precursor is reactive above at or above a threshold temperature to form the electrically insulative material. The mixture is initially provided within the reaction chamber at a temperature below the threshold temperature. Subsequently, the temperature of the mixture is raised to a temperature at or above the threshold temperature to form the electrically insulative material within at least one trench.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
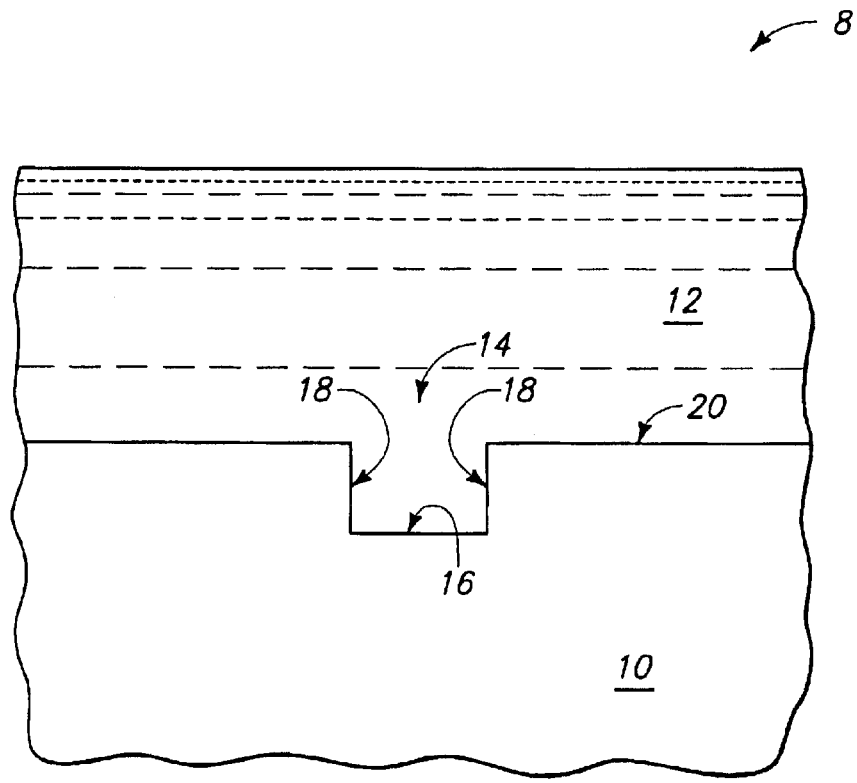
FIG. 1 is a diagrammatic, cross-sectional view of a semiconductor wafer fragment and a fluid, with the wafer fragment being at a preliminary processing stage in accordance with an exemplary aspect of the present invention.

This disclosure of the invention is submitted in furtherance of the constitutional purposes of the U.S. Patent Laws "to promote the progress of science and useful arts" (Article 1, Section 8).

In particular aspects, the invention encompasses new procedures for utilization of supercritical fluids in forming layers over substrates. Initially, a mixture is formed comprising a precursor of a desired material dissolved in a supercritical fluid. The precursor will react under appropriate conditions to form the desired material over a substrate. The mixture is placed in a reaction chamber with the substrate, but is initially placed in the reaction chamber under conditions at which the precursor does not react. Ultimately, the conditions are changed to those under which the precursor will react.

The mixture of precursor and supercritical fluid initially provided in the chamber can be considered a reservoir of precursor placed in the chamber under conditions at which the precursor is stable. The precursor within the mixture can be provided in a concentration which is in excess of that which can maximally react to form a layer over the substrate surface. The maximal rate of reaction of precursor is limited by kinetics of the precursor reaction, and the utilization of precursor dissolved in a mixture with supercritical fluid can, in particular aspects, be considered to provide a reservoir of precursor well in excess of the concentration that maximally reacts under the kinetic limitations of a particular process, which can insure that once the reaction of precursor starts it will proceed at a kinetically fastest rate rather than being rate limited by precursor concentration.

After a sufficient reservoir of precursor is established within the chamber, the conditions in the chamber are changed so that the precursor reacts to form the desired material layer over a surface of the substrate. The supercritical fluid preferably remains in a supercritical state during the reaction of the precursor (i.e., remains in a supercritical state after the conditions in the chamber are changed to those at which the precursor is reactive). Accordingly, the precursor remains dissolved in the supercritical fluid during the reaction, which can allow the high concentration of precursor to be maintained in a solvated state in the supercritical fluid as the precursor reacts to form the desired material over the substrate surface. This can enable the reaction utilized to form the desired material over the substrate surface to be limited solely by reaction kinetics, rather than by precursor concentration, during at least the initial stages of formation of the layer over the substrate. In particular aspects, the precursor will react with a composition at the surface of the substrate during formation of the layer over the substrate surface. Accordingly, the formation of the layer is a self-limiting process, and the precursor concentration can remain in high access over that required for maximal reaction rate during the entirety of the process of layer formation. In other aspects, the precursor will be used for layer formation until the precursor is substantially used up from within the reaction chamber. In such aspects, the rate of layer formation will eventually be limited by precursor concentration, but such will occur at later stages of layer formation, rather than throughout the entirety of the layer formation process.

As is known to persons of ordinary skill in the art, a supercritical fluid is defined as any substance that is above its critical temperature ($T_c$) and critical pressure ($P_c$). $T_c$ is the highest temperature at which a gas can be converted to a liquid by an increase in pressure, and $P_c$ is the highest pressure at which a liquid can be converted to a traditional gas by an increase in the liquid temperature. In the so-called critical region, there is only one phase, and it possesses properties of both gas and liquid. Supercritical fluids differ from traditional fluids in several aspects. For example, the solvent power of a supercritical fluid will typically increase with density at a given temperature. Supercritical fluids can be utilized to dissolve numerous materials, including, for example, metalorganics, to concentration levels far beyond those attainable in the gas phase (on the order of 1,000 times greater). Additionally, the gas-like behavior (i.e., lack of surface tension) of supercritical fluids can enable the fluids to permeate readily into small pores. In particular aspects, the present invention utilizes supercritical fluids to deliver high concentrations of precursor to surface features associated with semiconductor substrates. The surface features can include, for example, openings and/or trenches. In some aspects, the invention is utilized to form layers extending uniformly over the bottoms and sidewalls of trench structures, and ultimately to uniformly fill the trench structures with desired materials.

Any suitable supercritical fluid can be utilized for the present invention. An exemplary substance that can be utilized as a supercritical fluid is a substance comprising, consisting essentially of, or consisting of $CO_2$. The critical pressure of carbon dioxide is about 72.8 atmospheres, and the critical temperature is about 31° C.

In a particular aspect of the invention, a solid film precursor is delivered into a trench structure (or other feature associated with a substrate) as a mixture within a supercritical fluid. The mixture is initially provided so that a concentration of precursor is high, and a temperature of the concentration is below that at which the precursor reacts to form a desired material. The substrate is subsequently heated, which induces a kinetically limited reaction of the precursor. The reaction of the precursor deposits a film uniformly over features associated with a surface of the substrate.

In another aspect of the invention, a precursor is provided in a supercritical fluid, and a reactant (such as, for example a catalyst) is provided on the surface of a substrate. The supercritical fluid is provided proximate the substrate. The precursor reacts with the reactant at the surface of the substrate to form a layer across the surface.

Exemplary aspects of the invention are described with reference to FIGS. 1–12. Referring initially to FIG. 1, a cross-section 8 comprises a fragment of a substrate 10 proximate a fluid mixture 12. Substrate 10 can comprise, for example, monocrystalline silicon lightly doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 has an opening 14 formed therein. Opening 14 can be, for example, a trench with a length dimension extending into and out of the page relative to the FIG. 1 cross-sectional view. Opening 14 has a bottom periphery 16 and sidewall peripheries 18. Substrate 10 has a surface 20 which extends along uppermost regions of substrate 10, as well as along the peripheries 16 and 18 of opening 14. Although only one opening (or trench) is shown in FIG. 1, it is to be understood that the invention encompasses other aspects in which multiple openings are simultaneously treated.

Fluid mixture 12 comprises a precursor within a supercritical fluid. The precursor within mixture 12 can be in a supercritical state, or can be in a non-supercritical state solvated within a supercritical fluid. In particular aspects, mixture 12 will consist of the precursor and the supercritical fluid. The supercritical fluid can comprise any suitable material, and can, for example, comprise, consist essentially of, or consist of carbon dioxide. Thus, in some aspects of the invention mixture 12 can be considered to comprise a precursor and a portion other than the precursor, with the portion other than the precursor consisting essentially of, or consisting of, supercritical carbon dioxide.

The precursor within mixture 12 is a precursor of a desired material which is ultimately to be formed as a layer over at least a portion of surface 20. In one aspect, the precursor can comprise silicon and oxygen and the desired material can be silicon dioxide, with an exemplary precursor being tetraethyl orthosilicate. In another aspect, the precursor can comprise nitrogen and titanium and the desired material can be titanium nitride, with an exemplary precursor being tetrakis(dimethylamido) titanium. In another exemplary aspect, the precursor can comprise nitrogen and tantalum and the desired material can be tantalum nitride, with an exemplary precursor being pentakis-(dimethylamido) tantalum. In yet another exemplary aspect, the desired material can be hafnium oxide and the precursor can comprise oxygen and hafnium, with an exemplary precursor being hafnium tert-butoxide.

The precursor within mixture 12 will, under particular conditions, react to form the desired material over at least a portion of surface 20. Mixture 12 and substrate 10 are initially provided within a reaction chamber under conditions at which the precursor is stable relative to reaction to form the desired material. After the mixture and substrate are within the chamber, and while the supercritical state of the supercritical fluid is maintained, the conditions are changed to new conditions under which the stability of the precursor is altered so that the precursor now reacts to form the desired material over the surface of substrate 10. The initial conditions at which the precursor is stable can be referred to as first conditions, and the conditions at which the precursor reacts to form the desired material can be referred to as second conditions.

Figure 2:
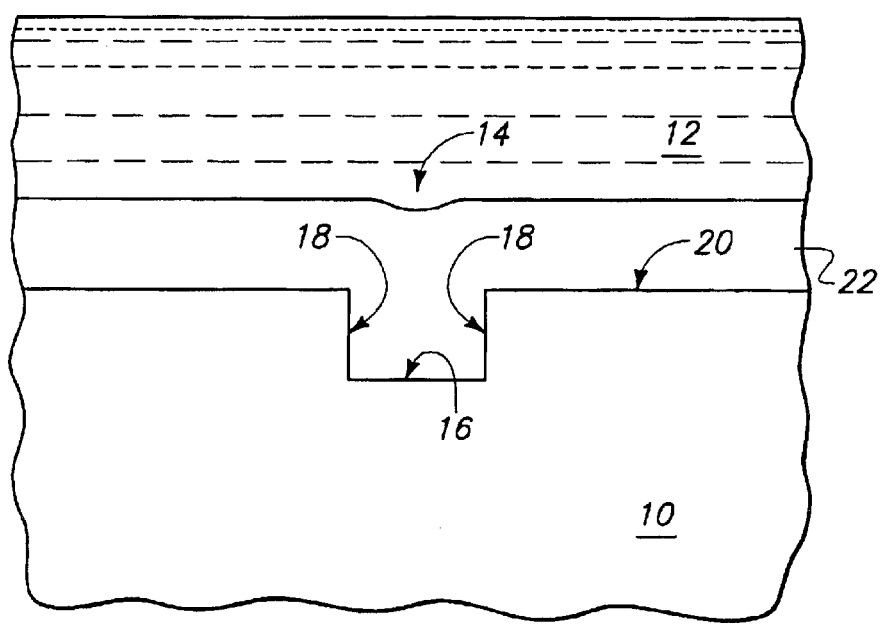
FIG. 2 is a view of the FIG. 1 semiconductor wafer fragment and fluid, with the wafer fragment being at a processing stage subsequent to that of FIG. 1.

FIG. 2 shows the cross-section 8 at a processing stage subsequent to that of FIG. 1, and specifically after a layer 22 has been formed over surface 20 of substrate 10. Layer 22 fills opening 14.

Layer 22 comprises a desired material formed from reaction of the precursor that had initially been provided within mixture 12. Layer 22 can, in particular aspects, comprise, consist essentially of, or consist of titanium nitride, tantalum nitride, silicon dioxide, or hafnium oxide.

The reaction of the precursor to form the desired material 22 can occur at an interface of the supercritical phase of mixture 12 and a solid surface (i.e., the surface of substrate 10 initially, or the surface of growing layer 22 subsequent to the initial formation of layer 22). Alternatively, the reaction of the precursor to form the desired material can occur entirely in the mixture (i.e., in the fluid phase), and the desired material can transfer from the mixture to the substrate to form the layer 22 on substrate 10.

If layer 22 forms from reaction of a precursor with a composition at surface 20 of layer 10, then an entirety of the desired material formed from the precursor can be incorporated into the layer 22 formed over surface 20. If, in contrast, the desired material forms from reaction of precursor within mixture 12 and subsequent deposition of the material onto surface 20 as layer 22, some of the desired material can remain within the mixture after formation of the desired material. Accordingly, the invention encompasses aspects in which at least some of the desired material formed from a precursor is deposited over layer 20 of substrate 10, and comprises particular aspects in which all of the desired material formed from the precursor is incorporated into a layer over the surface 20 of substrate 10.

Although the invention is described with reference to a process in which a single precursor is provided within mixture 12 and utilized to form the desired material, it is to be understood that the invention encompasses other aspects in which two or more precursors are provided within mixture 12 and utilized to form the layer. If two or more precursors are utilized from the mixture 12, the change in conditions within the mixture which lead to reactivity of a precursor can be such that the reactivity of more than one precursor is altered. Alternatively, the change in conditions can be such that the reactivity of only one of the multiple precursors is altered. The change in reactivity of one precursor can then set off reactions with other precursors to form the desired material. For purposes of interpreting this disclosure and the claims that follow, the term "precursor" can be understood to encompass any reactant which is ultimately utilized to form a desired material, and which has at least a portion thereof incorporated into the desired material.

Figure 12:
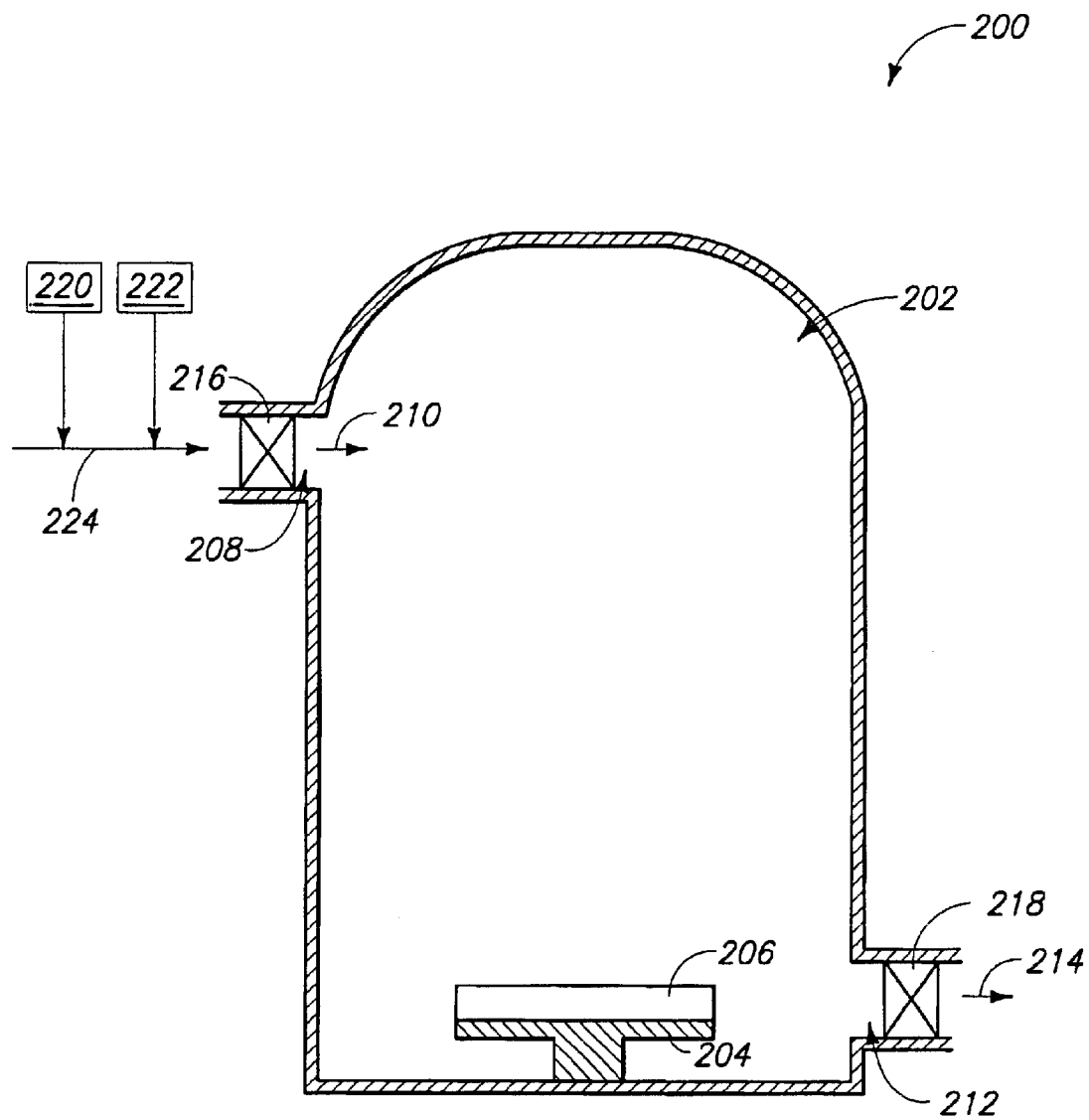
FIG. 12 is a diagrammatic, cross-sectional view of an exemplary reaction chamber that can be utilized in various aspects of the present invention.

FIG. 12 shows an exemplary apparatus 200 which can be utilized for the processing of FIGS. 1 and 2. Specifically, apparatus 200 comprises a reaction chamber 202, and a substrate supporting apparatus 204 within the chamber. An exemplary substrate 206 is shown supported by apparatus 204. Substrate 206 can, in particular aspects, comprise a monocrystalline silicon wafer. Although only one substrate is shown, it is to be understood that a plurality of substrates could be simultaneously treated within chamber 202.

An inlet 208 is provided to allow materials to be flowed into chamber 202 (with the material flow being represented by arrow 210), and an outlet 212 is provided to allow materials to be exhausted from within chamber 202 (with the flow of exhausted materials being represented by arrow 214). A valve 216 is provided across the inlet 208 to control flow of materials through the inlet; and a valve 218 is provided across the outlet 212 to control flow of materials through the outlet.

A first source 220 and second source 222 are shown external to reaction chamber 202. One of the first and second sources can be a source of fluid which is ultimately to be maintained in a supercritical state within chamber 202, and the other of the sources can be a source of precursor ultimately utilized to form a desired material over substrate 206. Although only one precursor source is shown in the exemplary aspect of the invention, it is to be understood that multiple precursor sources could be utilized. Also, multiple sources of solvent to be utilized in a supercritical state could be provided.

Components from sources 220 and 222 are mixed to form a mixture 224 (represented by an arrow) which is flowed into reaction chamber 202. The mixture can comprise the precursor dissolved in a supercritical fluid prior to flowing the mixture into chamber 202, or alternatively the supercritical state of a component of the mixture can be achieved after flowing the mixture into chamber 202. Also, it is to be understood that the shown aspect of the invention is but one of several techniques for forming a precursor dissolved in supercritical fluid within chamber 202. Another exemplary technique is to initially form the supercritical fluid within chamber 202, and subsequently to flow the precursor into chamber 202 so that the mixture is formed within chamber 202, rather than externally of chamber 202.

The mixture of precursor within supercritical fluid in reaction chamber 202 is, in particular aspects of the invention, initially under conditions at which the precursor is stable relative to reaction to form a desired material. Subsequently, the conditions are changed so that the precursor reacts to form the desired material, but the supercritical state of the supercritical solvent is maintained as the precursor reacts. The change in conditions can comprise, for example, a change in temperature. Specifically, the mixture of precursor and supercritical fluid can initially be provided within chamber 202 at a first temperature at which the precursor substantially non-reactive, and subsequently the temperature can be raised to a second temperature at which the precursor reacts to form the desired material. The temperature within an entirety of chamber 202 can be changed, or alternatively the temperature of substrate 206 can be changed while the temperature within the majority of the remainder of chamber 202 remains unchanged. In such aspects, reaction of the precursor will occur proximate substrate 206, but will not occur within most of the majority of chamber 202. The change in temperature of substrate 206 can be accomplished with, for example, a temperature controller (not shown) provided within substrate holder 204. Such temperature controller can comprise one or both of a heating mechanism and a cooling mechanism.

In an exemplary aspect, the precursor provided within chamber 202 will be tetraethyl orthosilicate, and such will be dissolved in a supercritical fluid consisting essentially of carbon dioxide. Tetraethyl orthosilicate has a decomposition temperature of about 400° C. Such temperature can be considered a threshold temperature for a reaction of the precursor. Specifically, if the precursor is below the threshold temperature there will be substantially no reaction of the precursor to form the desired material silicon dioxide, and if the precursor is at or above the threshold temperature the precursor will react to form the silicon dioxide. Accordingly, the precursor can be initially provided at a temperature significantly below the threshold temperature, such as, for example, a temperature of about 100° C. Subsequently, the temperature can be increased to at least the threshold temperature to cause the tetraethyl orthosilicate to react to form the silicon dioxide.

Temperature is one of the conditions that can be altered to change reactivity of a precursor. Other conditions will be recognized by persons of ordinary skill in the art, and can include, for example, pressure.

The methodology utilized for processing in a reaction chamber (such as chamber 202) in accordance with the present invention will typically be a batch process, rather than continuous flow.

Figure 3:
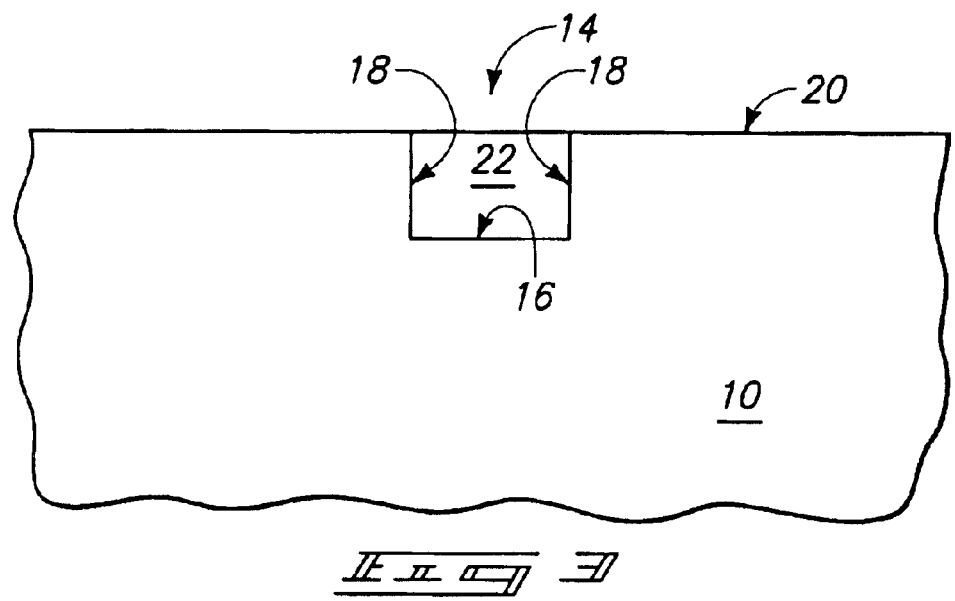
FIG. 3 is a view of the FIG. 1 wafer fragment shown at a processing stage subsequent to that of FIG. 2.

FIG. 3 shows substrate 10 at a processing stage subsequent to that of FIG. 2. Specifically, the substrate is no longer proximate the mixture 12. Such can be accomplished by exhausting mixture 12 from within the reaction chamber 200 (FIG. 12) and removing the substrate from the chamber.

Figure 4:
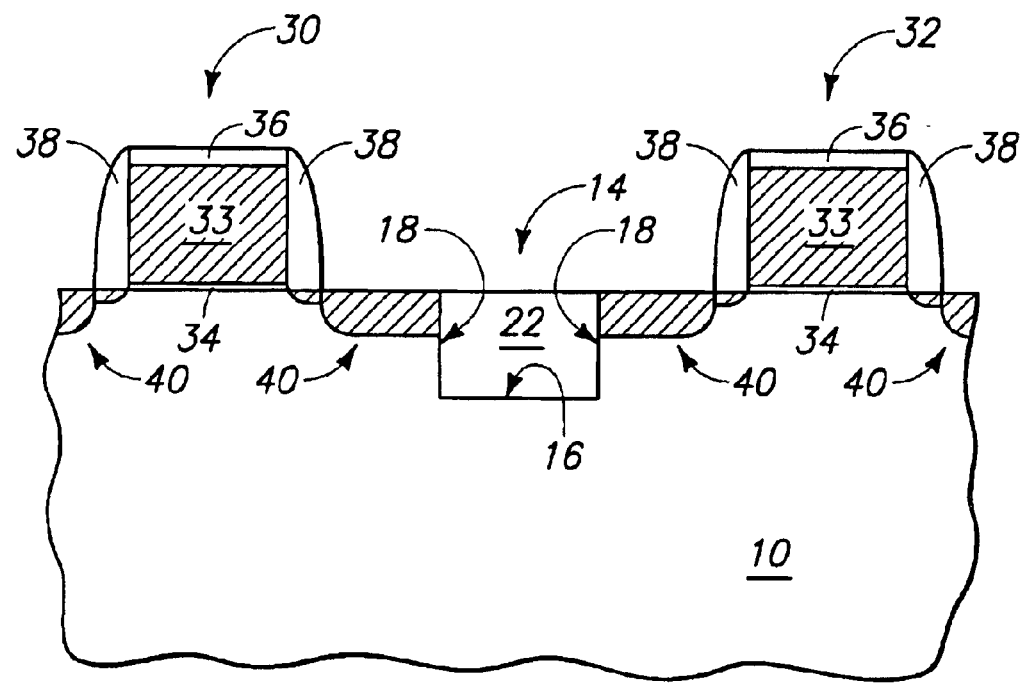
FIG. 4 is a view of the FIG. 1 wafer fragment shown at a processing stage subsequent to that of FIG. 3.

Layer 22 has been removed from over the upper surface of substrate 10, but remains within opening 14. Such can be accomplished by, for example, chemical-mechanical polishing. The material 22 within opening 14 can be any desired material, and can be, for example, electrically conductive or electrically insulative. In particular aspects, the material will be electrically insulative, and will ultimately be utilized to form an isolation region. Such aspect is illustrated in FIG. 4.

Specifically, a pair of circuit devices 30 and 32 are shown electrically separated from one another by an isolation region comprising material 22 within opening 14. The isolation region can be considered to correspond to a trenched isolation region, and material 22 can comprise any suitable electrically insulative material. In particular aspects, material 22 will comprise, consist essentially of, or consist of silicon dioxide. Utilization of the methodologies described with reference to FIGS. 1 and 2 advantageously can enable the silicon dioxide to be formed uniformly within trench 14, even in aspects in which the trench has a relatively high aspect ratio.

The shown circuit components 30 and 32 correspond to transistor devices. Specifically, each of the components comprises a transistor gate 33 which contains one or more suitable electrically conductive materials, such as, for example, metals, metal compounds, and/or conductively-doped silicon. The gates 33 are separated from substrate 10 by an electrically insulative material 34. Such electrically insulative material can comprise, consist essentially of, or consist of silicon dioxide. Insulative material caps 36 are formed over conductive gates 33. The insulative material of caps 36 can comprise, for example, one or both of silicon nitride and silicon dioxide. Insulative sidewall spacers 38 extend along sidewalls of gates 33. Sidewall spacers 38 can comprise any suitable electrically insulative material, including, for example, silicon nitride and/or silicon dioxide. Conductively-doped source/drain regions 40 extend into substrate 10. In particular aspects, substrate 10 can comprise a monocrystalline silicon wafer. In such aspects, source/drain regions 40 can be formed by implanting suitable conductivity-enhancing dopant into substrate 10.

Figure 5:
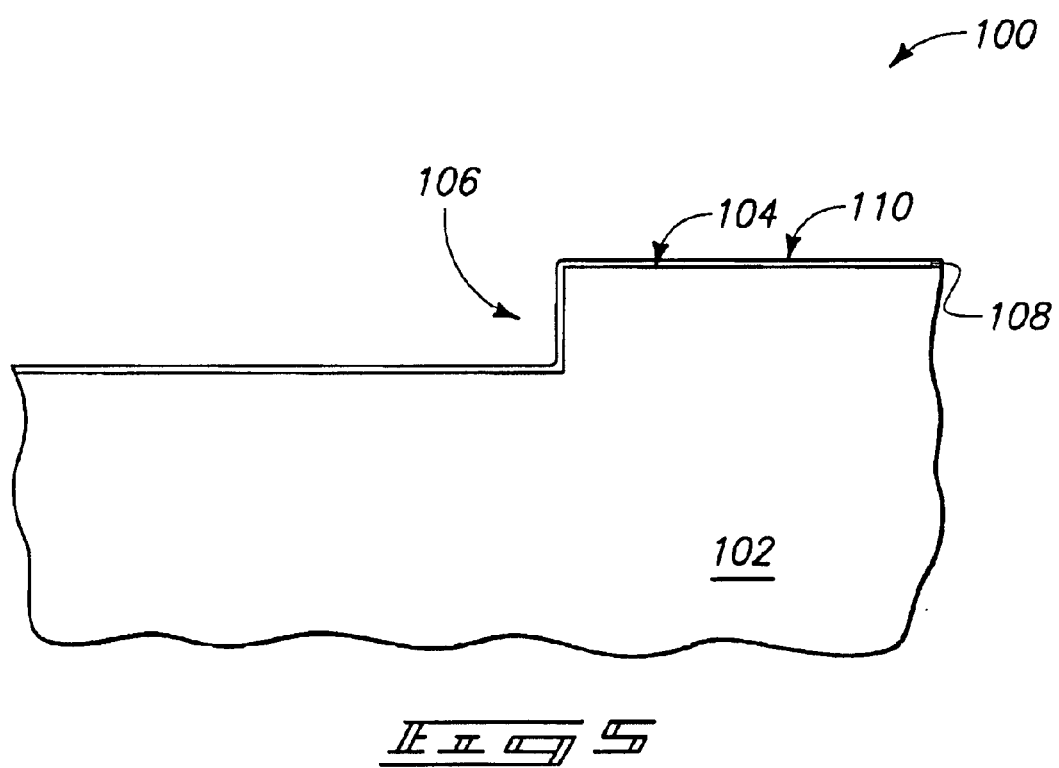
FIG. 5 is a view of a semiconductor wafer fragment shown at a preliminary processing stage in accordance with another aspect of the present invention.

Another exemplary aspect of the invention is described with reference to FIGS. 5–11. Referring initially to FIG. 5, a fragment 100 is shown comprising a substrate 102. Substrate 102 can be any suitable substrate, including, for example, a semiconductor substrate. In particular aspects, substrate 102 can comprise, consist essentially of, or consist of monocrystalline silicon.

Substrate 102 comprises a surface 104, and a topographical feature 106 is shown associated with surface 104. In the FIG. 5 aspect of the invention the topographical feature is a step, but it is to be understood that the topographical feature can comprise any feature, including, for example, an opening formed to a high aspect ratio, a rugged surface topography, etc.

A layer 108 is formed over surface 104. Layer 108 comprises a composition which is reactive with a precursor (discussed below) under particular conditions. The reactive composition can be, in some aspects, a catalyst. Layer 108 has a surface 110, which in the shown aspect of the invention is conformal to surface 104 of substrate 102. As discussed previously, the term "substrate" is broad enough to encompass any material or combination of materials. Accordingly, in particular aspects of the invention layer 108 together with base material 102 can be considered a substrate, and in such aspects surface 110 can be considered a surface of the substrate.

Figure 6:
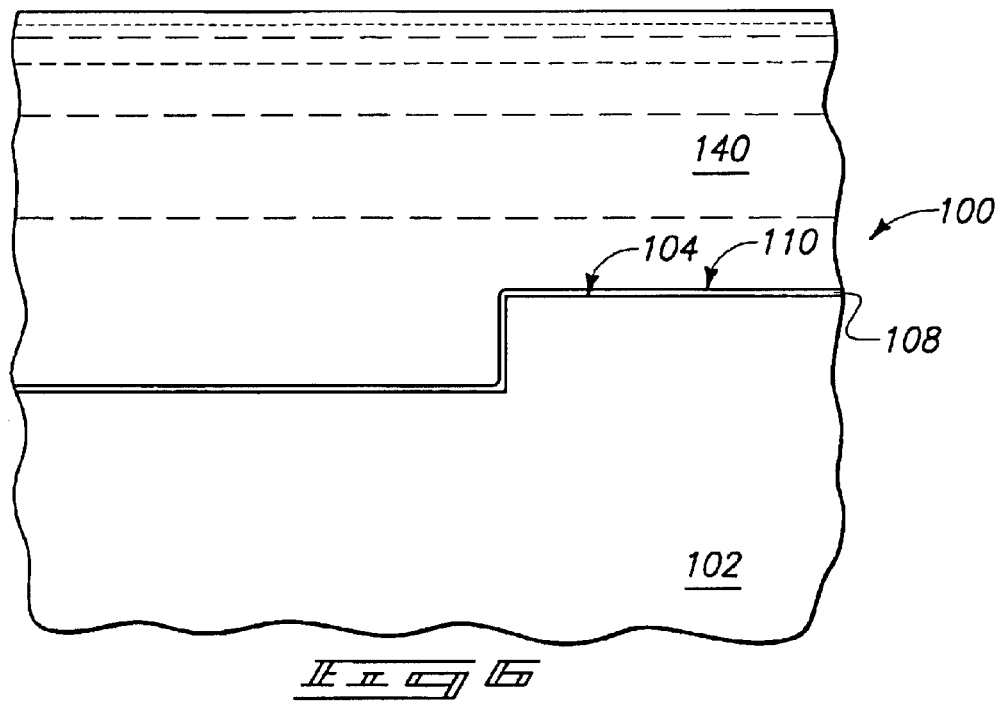
FIG. 6 is a view of the FIG. 5 wafer fragment proximate a supercritical fluid.

Referring to FIG. 6, construction 100 is provided proximate a mixture 140. The mixture 140 comprises one or more precursors within a supercritical fluid, and accordingly is analogous to the mixture 12 described above with reference to FIGS. 1 and 2. At least one precursor within mixture 140 reacts directly with the composition of surface 110 under particular conditions. Mixture 140 and construction 100 can initially be provided in a reaction chamber (such as, for example, the reaction chamber discussed above with reference to FIG. 12) under conditions other than the particular conditions at which the precursor reacts with surface 110. Such can allow a large reservoir of precursor to be provided adjacent surface 110 by the precursor solvated within the supercritical fluid of mixture 140.

Figure 7:
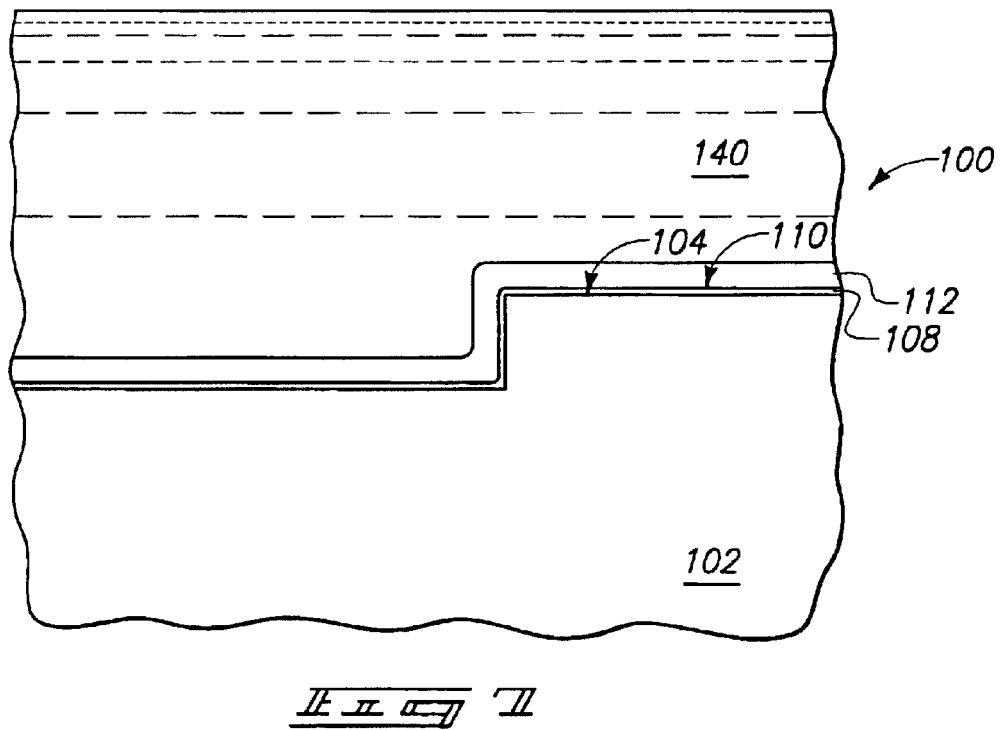
FIG. 7 is a view of the FIG. 5 wafer fragment proximate the supercritical fluid of FIG. 6, with the fragment being shown at a processing stage subsequent to that of FIG. 6.

Referring to FIG. 7, the conditions of at least some of mixture 140 can subsequently be changed to the particular conditions under which one or more precursors react with the composition of surface 110. Such causes a material 112 to be formed over surface 110 from reaction of the composition of surface 110 with the precursor. Although material 112 is formed over surface 110 in the exemplary shown embodiment, it is to be understood that the invention encompasses other aspects (not shown) in which material of layer 108 is consumed in the formation of material 112. In such aspects, layer 108 can be removed through reaction with precursor within mixture 140, and layer 112 can be formed directly against an upper surface of base material 102.

In an exemplary aspect of the invention, material 108 comprises tetramethylaluminum, a precursor within mixture 140 comprises tris(tert-butoxy)silanol, and the material 112 comprises, consists essentially of, or consists of silicon dioxide. In such aspect, the changing of the conditions of the mixture to the particular conditions which cause formation of material 112 can comprise raising a temperature of the mixture. In such aspect of the invention, the formation of the silicon dioxide can be self limiting, and the silicon dioxide will typically form to a thickness of 100 Å or less.

The heating of mixture 140 to cause formation of material 112 from the precursor can be accomplished by heating all of the mixture within a reaction chamber, or by selectively heating only a portion of the mixture proximate layer 108. If only a portion of the mixture is to be heated, such can be accomplished, for example, by heating the construction comprising base 102 and layer 108. The temperature of the portion of mixture 140 proximate the layer 108 can then be elevated due to thermal transfer from layer 108 to the portion of the mixture.

The processing of FIGS. 5–7 can be repeated to form additional silicon dioxide layers over the layer 112. Such is illustrated in FIGS. 8–11.

Figure 8:
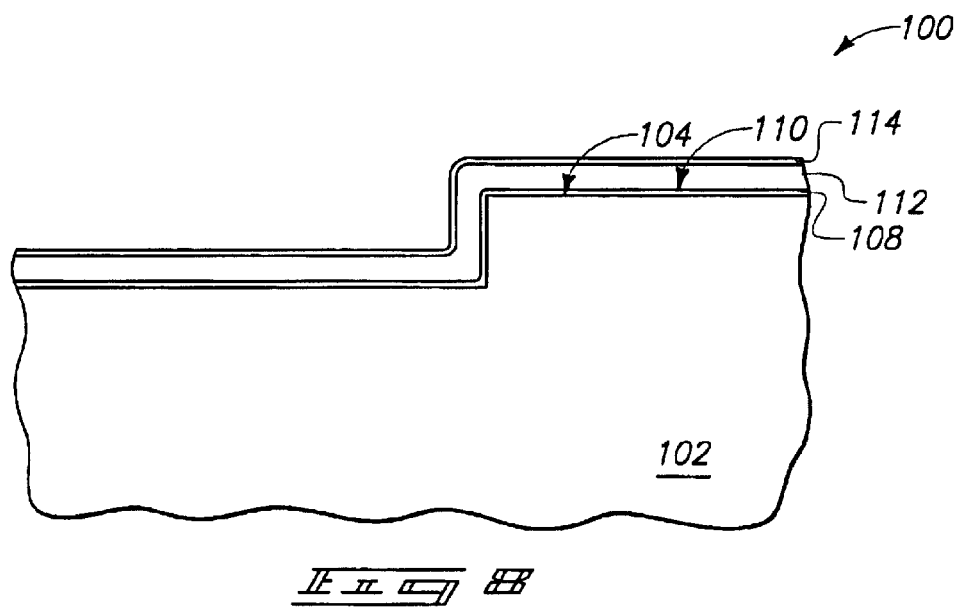
FIG. 8 is a view of the FIG. 5 wafer fragment shown at a processing stage subsequent to that of FIG. 7.

FIG. 8 shows construction 100 removed from proximate mixture 140 (FIG. 7), and shows a layer 114 formed over layer 112. Layer 114 can have a composition identical to that described previously with reference to layer 108, and accordingly can comprise, consist essentially of, or consist of tetramethylaluminum.

Figure 9:
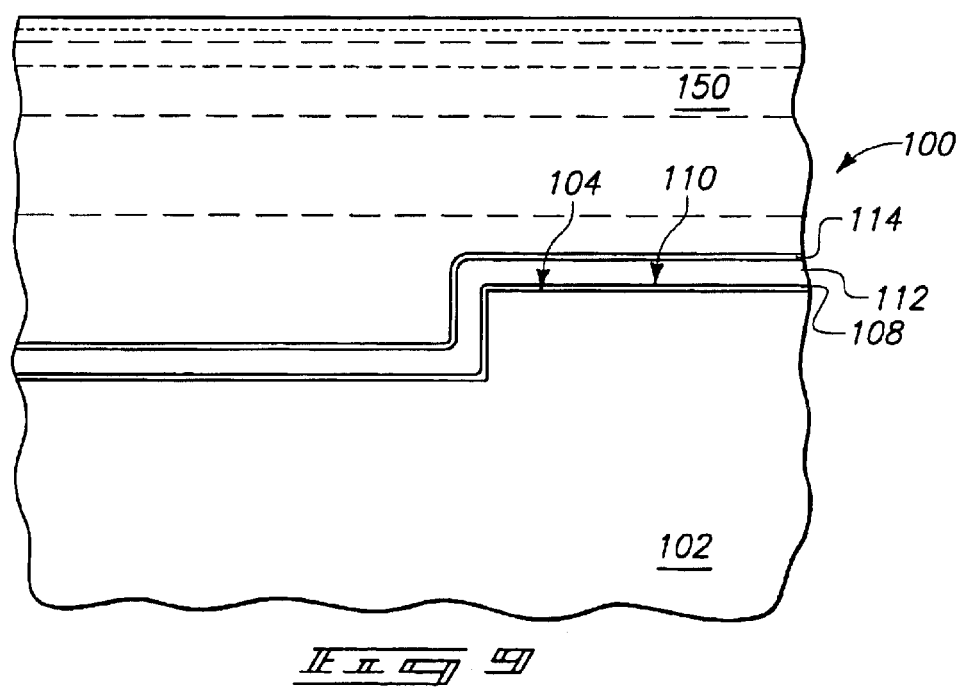
FIG. 9 is a view of the FIG. 8 wafer fragment shown proximate a supercritical fluid.
Figure 10:
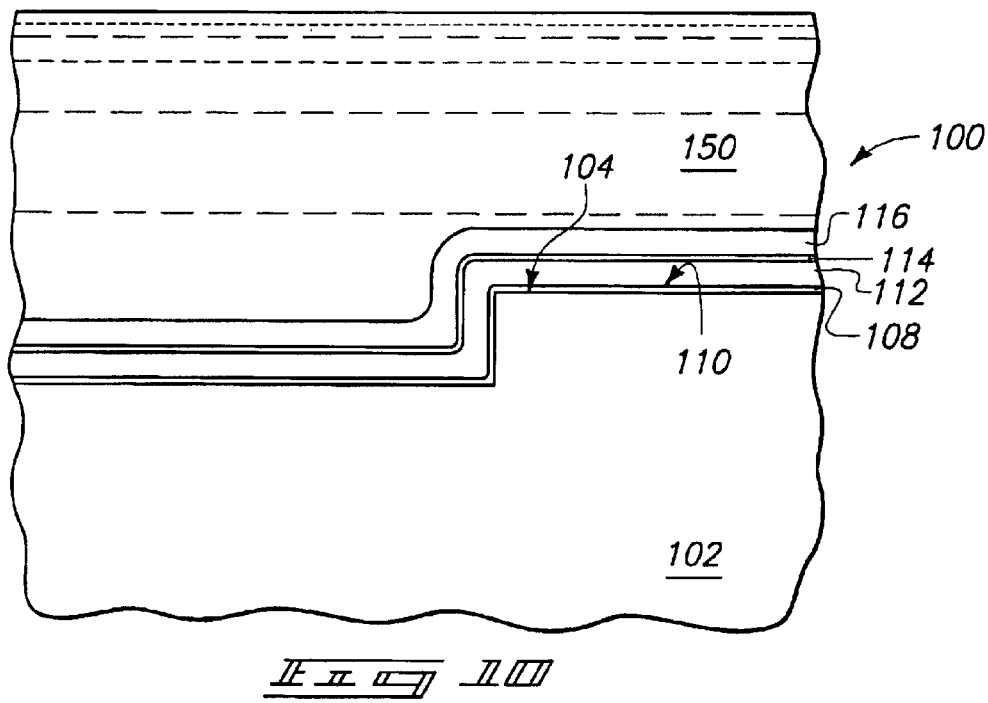
FIG. 10 is a view of the wafer fragment of FIG. 9 shown at a processing stage subsequent to that of FIG. 9, and shown proximate the supercritical fluid of FIG. 9.

Referring to FIG. 9, the construction from FIG. 8 can be provided within a reaction chamber and proximate a mixture 150 having the composition described previously for mixture 140 of FIGS. 6 and 7 (or, in some aspects, having a different composition with a different precursor). Initially, mixture 150 can be under conditions at which a precursor within the mixture does not react with a surface of layer 114. Subsequently, at least a portion of mixture 150 can be changed to conditions in which a precursor from the mixture does react with the surface 114 to form a layer over surface 114. FIG. 10 illustrates construction 100 after a layer 116 forms over layer 114. Layer 116 can comprise, consist essentially of, or consist of silicon dioxide, and can be formed by reaction of, for example, tris(tert-butoxy)silanol from mixture 150 with a composition of the surface of layer 114.

Figure 11:
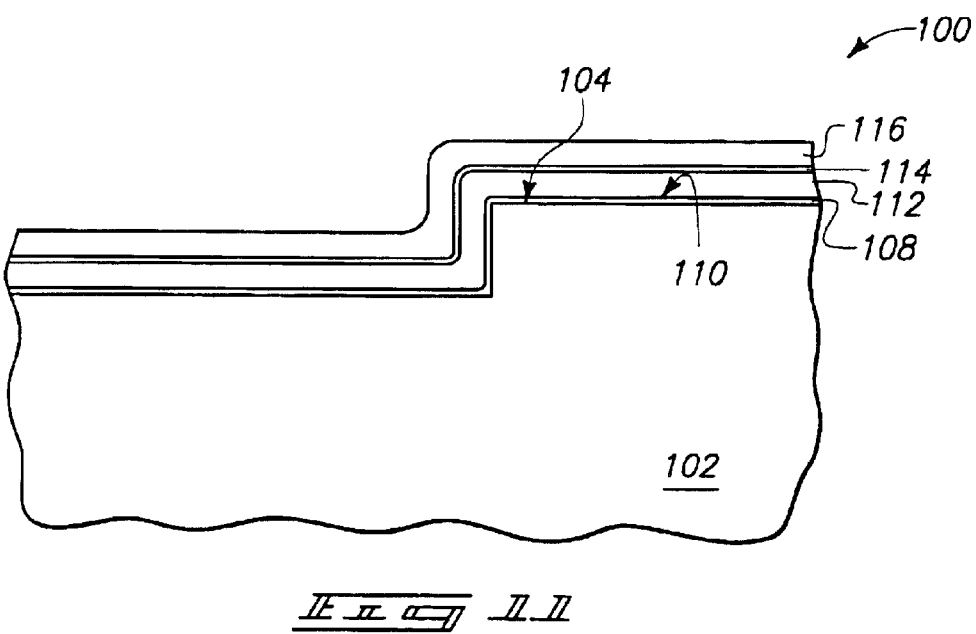
FIG. 11 is a view of the FIG. 10 wafer fragment shown in isolation from the supercritical fluid of FIG. 10.

FIG. 11 shows construction 100 after removal from proximate mixture 150 (FIG. 10).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming at least one trenched isolation region, comprising:

providing a semiconductor substrate within a reaction chamber, the substrate having at least one trench extending therein;

providing a mixture within the chamber, the mixture comprising a precursor of an electrically insulative material within a supercritical fluid, the precursor being reactive at or above a threshold temperature to form the electrically insulative material, the mixture being initially provided within the reaction chamber at a temperature below the threshold temperature; and raising the temperature of at least some of the mixture to a temperature of at least the threshold temperature to form the electrically insulative material within the at least one trench.

2. The method of claim 1 wherein the reaction of the precursor to form the electrically insulative material occurs entirely in the mixture; and wherein the electrically insulative material transfers from the mixture to within the at least one trench.

3. The method of claim 1 wherein supercritical fluid defines a supercritical phase within the reaction chamber, and wherein the reaction of the precursor to form the electrically insulative material occurs at an interface of the supercritical phase and a surface of the substrate.

4. The method of claim 1 wherein the substrate has a surface composition, and wherein the precursor reacts with the surface composition at or above the threshold temperature to form the electrically insulative material within the at least one trench.

5. The method of claim 1 wherein the temperature of the mixture is raised by heating the substrate and transferring heat from the substrate to the mixture.

6. The method of claim 1 wherein the substrate is a semiconductor substrate.

7. The method of claim 1 wherein the substrate comprises monocrystalline silicon.

8. The method of claim 1 wherein the precursor comprises silicon and oxygen, and wherein the electrically insulative material is silicon dioxide.

9. The method of claim 1 wherein the precursor is tetraethyl orthosilicate, and wherein the electrically insulative material is silicon dioxide.

10. The method of claim 1 wherein the precursor is tris(tert-butoxy)silanol, and wherein the electrically insulative material is silicon dioxide.

* * * * *

UNITED STATES PATENT AND TRADEMARK OFFICE
CERTIFICATE OF CORRECTION

PATENT NO. : 6,835,664 B1
DATED : June 25, 2003
INVENTOR(S) : Demetrius Sarigiannis et al.

It is certified that error appears in the above-identified patent and that said Letters Patent is hereby corrected as shown below:

Column 2,
Lines 15-16, replace "The precursor is reactive above at or above a threshold temperature to form the" insert -- The precursor is reactive at or above a threshold temperature to form the --.

Signed and Sealed this

Twenty-fourth Day of January, 2006

JON W. DUDAS
*Director of the United States Patent and Trademark Office*